United States Patent [19]
Pullen et al.

[11] Patent Number: 6,118,336
[45] Date of Patent: Sep. 12, 2000

[54] START-UP CIRCUIT FOR SELF OSCILLATING CLASS D MODULATOR

[75] Inventors: Stuart W. Pullen, Raleigh, N.C.; Donald R. Preslar, Somerville, N.J.

[73] Assignee: Intersil Corporation, Palm Bay, Fla.

[21] Appl. No.: 09/183,879

[22] Filed: Oct. 30, 1998

[51] Int. Cl.[7] .................................................... H03F 3/38
[52] U.S. Cl. .......................................... 330/10; 330/207 A
[58] Field of Search .................................. 330/10, 207 A, 330/251; 332/109

[56] References Cited

U.S. PATENT DOCUMENTS

| | | | |
|---|---|---|---|
| Re. 33,333 | 9/1990 | Taylorm, Jr. et al. | 330/10 |
| 5,111,158 | 5/1992 | Malec et al. | 330/10 |
| 5,382,915 | 1/1995 | Muri et al. | 330/10 |
| 5,442,317 | 8/1995 | Stengel | 330/10 |
| 5,613,010 | 3/1997 | Heyl et al. | 330/251 |
| 5,672,998 | 9/1997 | Wittlinger | 330/207 A |
| 5,805,020 | 9/1998 | Danz et al. | 330/10 |
| 5,929,702 | 7/1999 | Myers et al. | 330/10 |
| 5,973,368 | 10/1999 | Pearce et al. | 330/251 |

*Primary Examiner*—Robert Pascal
*Assistant Examiner*—Nguyen N. Khanh
*Attorney, Agent, or Firm*—Jaeckle Fleischmann & Mugel, LLP

[57] ABSTRACT

A class D modulator 100 is self oscillating. It includes an input stage 110, an operational amplifier 120, an integrator 130 and a pulse width modulator 140. A start-up generator 22 generates signals ENABLE and MUTE. The MUTE signal is connected to the input stage 110 to prevent any unwanted, initial sound. The ENABLE signal connects a start-up voltage source to the integrator 130 to set the initial voltage for integration. The ENABLE signal is coupled to a dead time control circuit 16 which controls the operation of the output power transistors 42, 44 to assure that the low side power transistor 44 is turned on before the high side transistor 42.

12 Claims, 4 Drawing Sheets

START-UP CIRCUIT FOR SELF OSCILLATING CLASS D MODULATOR

This invention relates in general to class D amplifiers and in particular to a method of organizing the amplifier start-up to achieve output stage boot-strapping, no "pop" enabling, and release of muting.

BACKGROUND OF THE INVENTION

Normal linear amplifiers are analog in nature and require only simple control functions such as an on/off switch and volume control. On the other hand, Class D amplifiers are digital in nature and have a number of time domain devices, such as, integrators, high speed comparators, deadtime control logic for Pulse Width Modulated (PWM) high voltage output switches, boot-strapped power supplies for driving the gates of DMOS switches, and output filters. Care must be taken to set the start up states of the time domain devices. Unless start-up conditions are carefully controlled, the modulator will make a poping noise when it is first turned on. In addition, serious damage can occur if the high side power transistor is turned on before the low side power transistor because the low side provides power supply voltage via a bootstrapped network for the proper operation of the high side.

SUMMARY OF THE INVENTION

The invention provides an improvement for a self oscillating Class D modulator that includes a low voltage pulse width modulator and isolated high and low side power transistors. The improvement includes a means for sensing the start up of the modulator, such as a power-on switch and a start-up generator means responsive to the sensing means for generating ENABLE and MUTE signal. There are means responsive to the ENABLE signal for turning on the low side power transistor driver before turning on the high side power transistor. The start-up generator includes means for delaying the generation of the MUTE signal for a set period of time following generation of the ENABLE signal. The integrator of the modulator is coupled to the ENABLE signal for setting the initial charge on the integrator. The ENABLE signal connects the integrator to a start-up reference voltage.

More specifically, the invention is a self oscillating Class D modulator with an improved start-up features. The modulator includes, in series, an input stage, an amplifier stage, an integrator stage with analog and digital feedback paths to its inputs, a comparator stage a deadtime driver stage, a coupler stage and an output stage comprising high side and low side power transistors. The start-up features are implemented by a start-up generator connected between the modulator and a power source for generating ENABLE and MUTE signals when the power source is connected to the modulator. The MUTE signal from the start-up generator is connected to the input stage to mute the output of the modulator during start-up. A dead time controller connected to the driver stage and to the ENABLE signal turns on the low side driver before turning on the high side driver. A start-up reference voltage is selectively connected by a transmission gate to the integrator for setting the initial voltage integrated by the integrator.

DESCRIPTION OF THE DRAWINGS

FIG. 2(c) is timing diagram of the output of the start-up generator; and

DETAILED DESCRIPTION

Figure 1A:
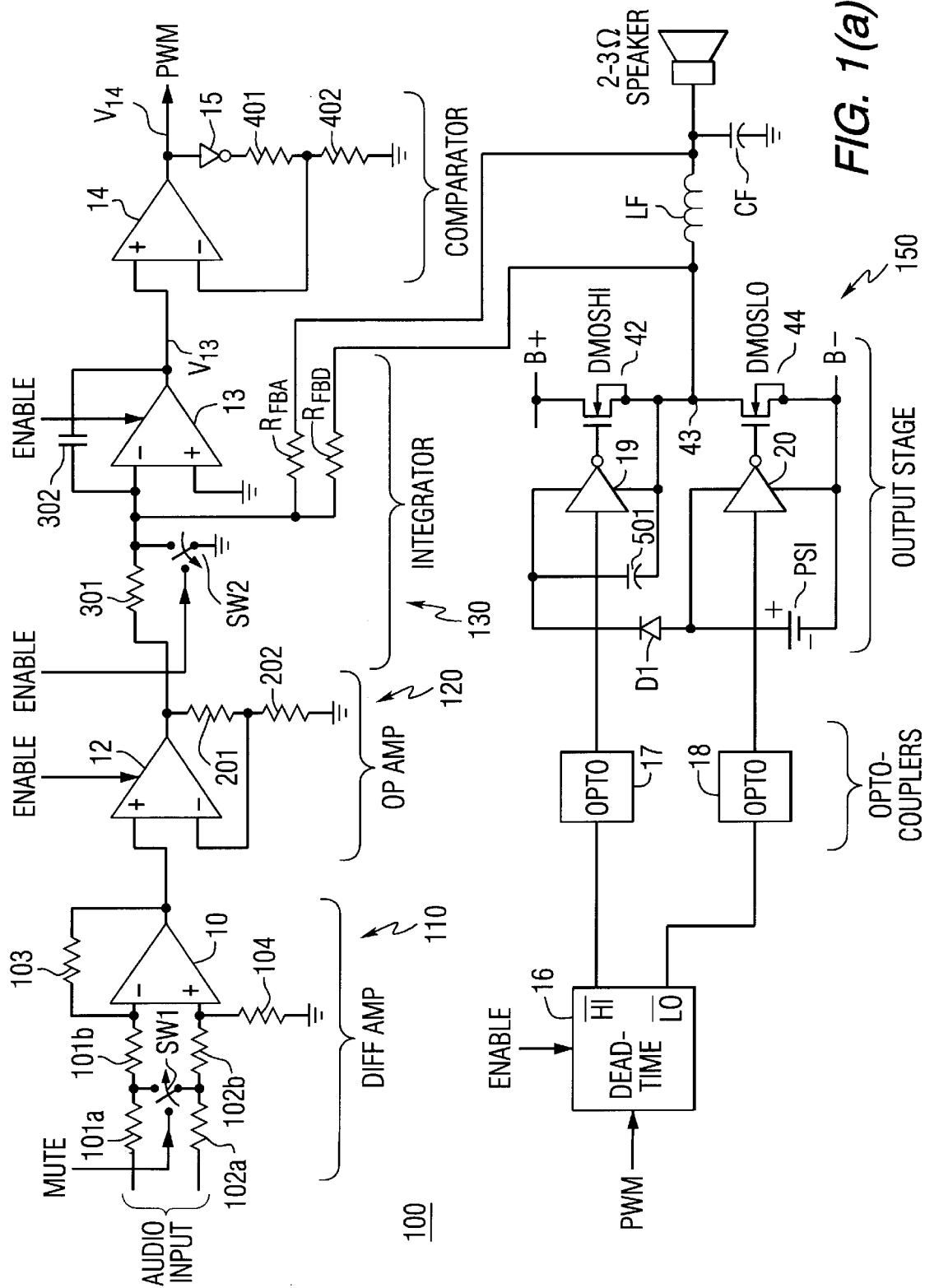
FIG. 1(a) is schematic of self oscillating Class D modulator with the start-up features of the inventions.

The circuit 100 shown in FIG. 1(a) is a Class D, self oscillating, variable frequency amplifier. It consists of a first stage 110 that includes a differential amplifier made up of an operational amplifier 10 and six gain setting resistors 101a, 101b, 102a, 102b, 103, and 104. This differential amplifier 1 10 has a mute function achieved by closing SW1. A second stage 120 is a non-inverting operational amplifier 12 with the gain set by resistors 201 and 202. Amplifier 12 also has a disable/enable function which sets its output voltage to approximately ground potential when disabled. A third stage is an integrator 130 composed of an operational amplifier 13, input resistor 301, and capacitor 302. This integrator 130 is enabled and disabled by a grounding switch SW2 and an enable input to the amplifier 13 which sets the output to a preselected output voltage level. The oscillation of the class D amplifier 100 is controlled by the integrator 130, a high speed hysteresis comparator consisting of comparator 14, logic inverter 15, and hysteresis feedback resistors 401, 402, and two feedback resistors RRBA and RFBD which pass signals back from the final amplifier output. RFBA supplies analog feedback from the speaker voltages and RFBD provides digital feedback from the PWM switched voltages prior to the final filter LF and CF. The output of the comparator 14 drives a deadtime control block 16 which functions to make sure that the output DMOS switches 42, 44 are never in the "on" state at the same time. As the PWM signal transitions from one state to the other the deadtime circuit 16 adds a small delay into the Hi or Lo output signal, whichever is in the process of turning on one of the output DMOS's. This delay gives the "on" DMOS time to turn off before the "off" DMOS turns on.

The circuitry up to this point is low power and low voltage circuitry. The output stage 150, however, is high voltage and high power supplied from two power supplies, B+and B−, typically + and −60 volts, respectively. The deadtime circuit 16 is coupled to the output stage 150 via two opto coupler isolators, 17 and 18. The isolators have low voltage input stages which are electrically isolated from their output stages. The input to output logical connection is accomplished via a light channel using Light Emitting Diodes and photo cells. Such an arrangement allows the output stage of the opto coupler to operate at considerably different voltage levels than the input stage. The output stage of the class D amplifier consists of two Dmos switches, DMOSHI 42 and DMOSLO 44, two gate drivers 19 and 20, a low voltage power supply PS1 for the gate drivers, a bootstrapped diode D1, and reservoir capacitor 501. The reservoir capacitor provides the power supply voltage for the high side gate driver 19 and is charged via the bootstrapped diode D1 when the low side DMOS 44 is "on".

The invention solves the problem of how to initialize and begin the operation of Class D amplification as follows:

1) A "mute" function removes any of the input signals during start up of the amplifier.

2) The integrator 130 receives an initial charge on its integrating capacitor to set the output voltage of the integrator. The initial state of the integrator output is set so that the low side output DMOS 44 turns on first. This is necessary in order to make sure that the reservoir capacitor 501 is properly charged before the gate driver 19 is required to control the high side DMOS 42.

3) The selfoscillation of the integrator 130 is started while the input signal is muted. In this case the output voltage is zero and there is no "pop-ing" sound during the initial period of oscillation.

4) The mute is finally removed and the input signal is allowed to modulate the self oscillation frequency and create an output voltage.

Figure 2A:
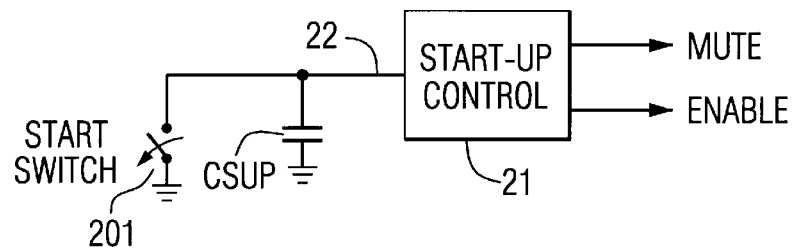
FIG. 2(a) is a block diagram of the start-up generator.
Figure 2B:
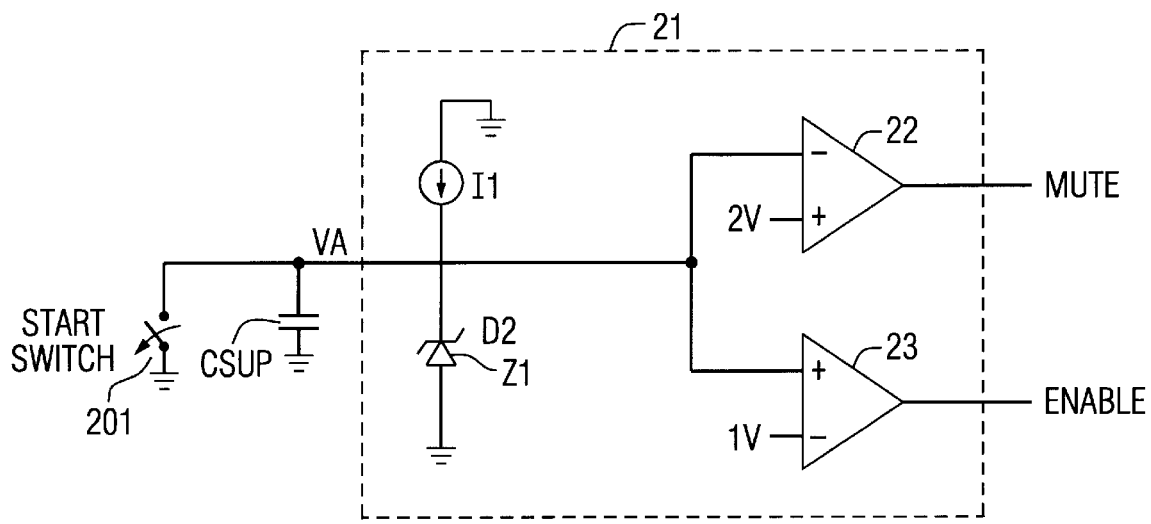
FIG. 2(b) is a schematic diagram of a circuit for the start-up generator.
Figure 2B:
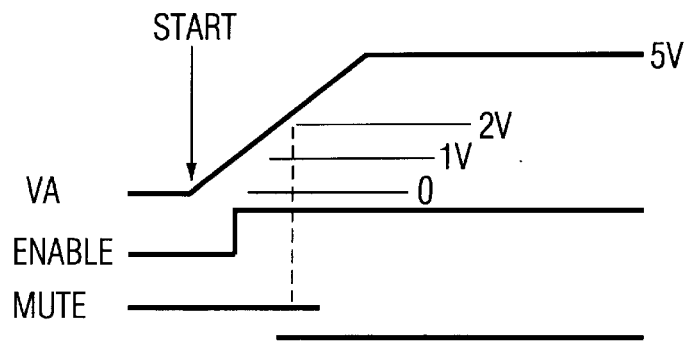

FIG. 2(a) illustrates the start-up generator 21 that generates the MUTE and ENABLE signals and FIG. 2(b) is a more detailed schematic. The generator 21 has an input 22 which is controlled by an external start switch 201 and a capacitor CSUP. FIG. 2(b) shows that internal to the generator 21 is a current source I1. When the switch 201 opens I1 creates a positive voltage ramp by charging the capacitor CSUP. Also internal to the generator 21 is a zener clamp Z1 to limit the input voltage and two comparators 22 and 23. Comparator 23 compares the voltage ramp against a first reference voltage level of 1 volt. Comparator 22 compares the voltage ramp against a second reference voltage level of 2 volts. When the ramp crosses the 1 volt level the ENABLE output which has been a logic low becomes a high. Later, when the ramp crosses the 2 volt level the MUTE output, which has been a logic high, becomes low and turns off the mute function. If the comparators are designed with a small hysteresis these transitions will be less likely to be disturbed by noise.

FIG. 2(c) is a timing diagram which illustrates how the voltage ramp begins and when the ENABLE signal switches to a logic high at a time delay, $T_E$. This delay of the ENABLE is used to allow the power supplies to settle during the powering up of the amplifier. At a still later time delay, $T_M$, the MUTE signal transitions from a logic high to a low. The delay between the ENABLE and MUTE transitions is used to establish the self oscillation of the amplifier before the input signals are applied and the MUTE signal is lifted.

Figure 3:
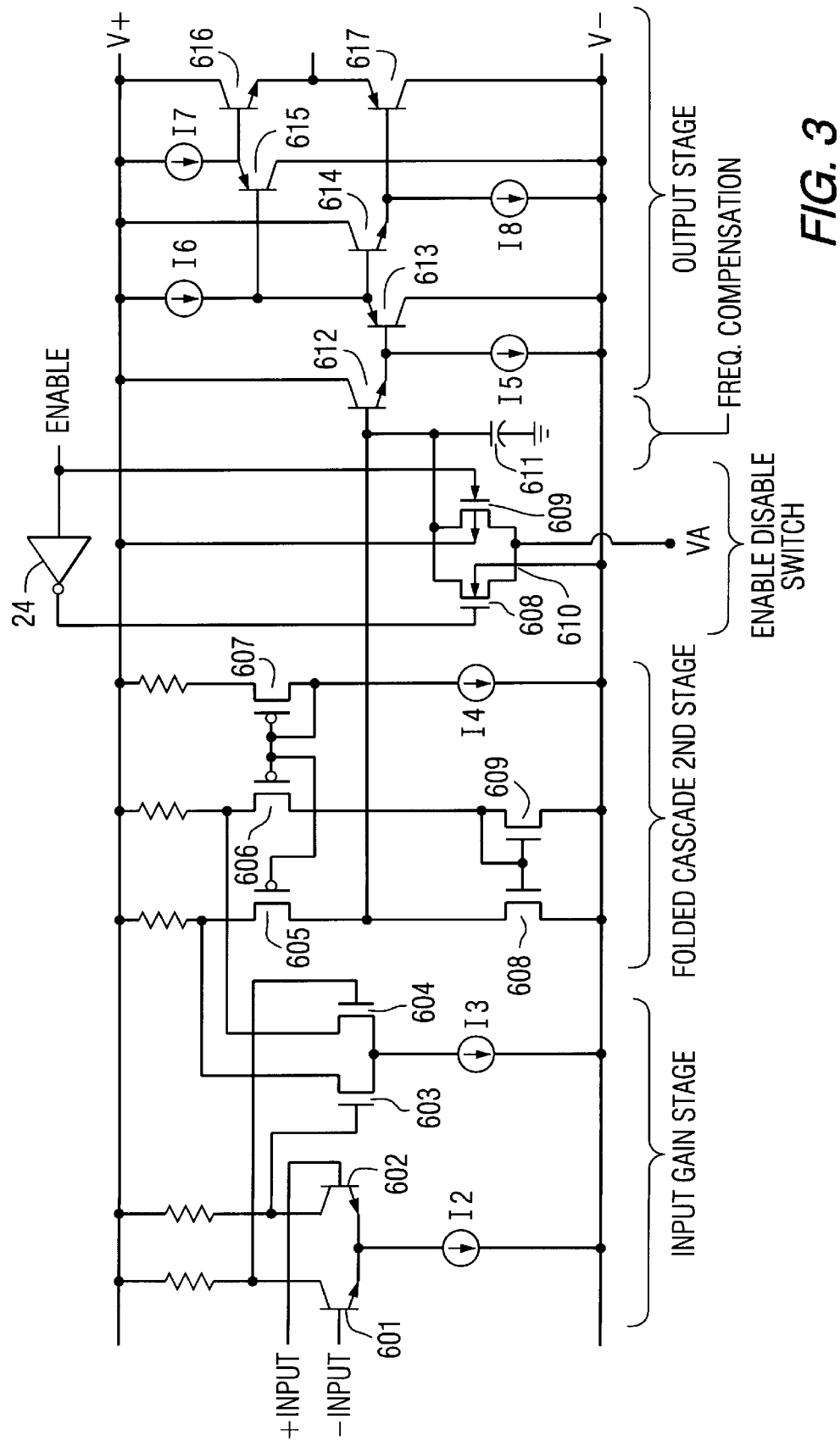
FIG. 3 is a schematic of the amplifier used in the integrator and the operational amplifer.

FIG. 3 is a circuit schematic of the operational amplifier used for the amplifier blocks 12 and 13 in FIG. 1. The amplifier power supplies V+ and V− are symmetrical around ground potential in order to assure that the input and outputs of the amplifier have sufficient voltage dynamic range around ground potential. The input stage of the operational amplifier is made of a low offset bipolar differential stage 601,602, and 12 followed by an MOS differential stage 603, 604 and I3. The MOS stage drives a folded cascode stage 605–609, and 14. A frequency compensation capacitor 611 is connected to the output of the folded cascode stage. Capacitor 611 sets the dominant frequency pole of the amplifier and assures that the phase margins around the feedback loop are sufficient to guarantee stable amplifier operation. The output stage 612–617, I5-I8 comprises two emitter followers and a four transistor push-pull configuration. The enable/disable input to the amplifier controls a transmission gate switch which switches the summing node 610 of the folded cascode to Va. If Va is 0.0 volts, the amplifier output is forced to approximately 0.0 volts. For disabling operational amp 12, Va is normally 0 volts so that when disabled the input currents through the integrating resistor 301 is zero, since the other end of the resistor is switched to 0 volts by SW2 during disable. For disabling operational amplifier 13, it's Va is normally a negative of −0.8 volts in order to force the output to −0.8 volts. This level is selected to drive the comparator inputs below the comparator hysteresis level and provide a low logic level on the PWM output. Note that any number of output stage configurations for this amplifier are feasible, one of which might involve removing one the emitter followers which would result in a shift in the voltage relationship between VA and the disabled output voltage.

The deadtime circuit 16 operates so that with a low PWM input signal and a initial preconditioning logic low pulse on it's ENABLE input, deadtime circuit 16 will have a low LO output and a high HI output. The opto blocks 17, 18 being logically non-inverting and gate driver 20 being logically inverting and the low side DMOSLO 44 is initially in the "on" state when the enable signal goes to a logic high. It is essential to turn the DMOSLO on first in order to achieve a bootstrap charging of the reservoir capacitor 501 which provides the power for gate driver 19. Once capacitor 501 is charged then the high side DMOS DMOSHI 42 can be operated and the class D amplifier can then begin pulsing the output filter in response to the PWM signal.

Figure 1B:
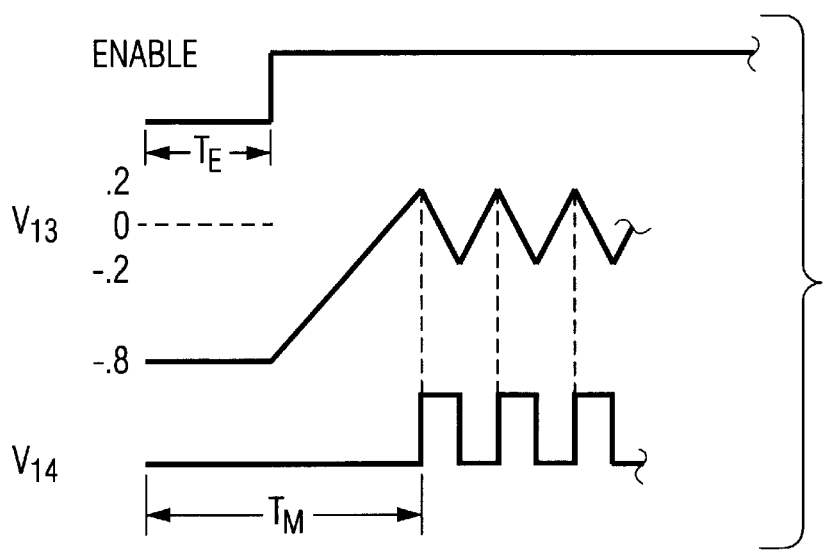
FIG. 1(b) is a timing diagram of output of the integrator of the modulator.
Figure 1C:
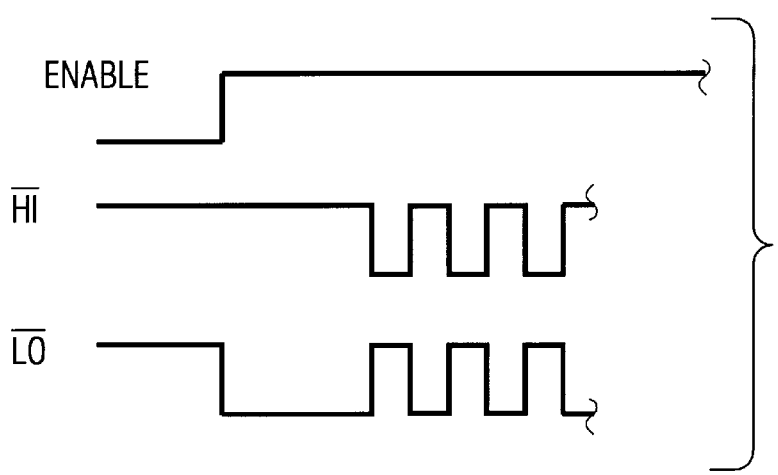
FIG. 1(c) is a timing diagram of the output of the dead time circuit.

FIG. 1(c) is a timing diagram which illustrates the timing relationship of the ENABLE, HI, and LO signals. Initially when ENABLE is logically low both HI and LO are logically high which keeps both DMOSHI 42 and DMOSLO 44 in the off state. When ENABLE goes logically high the LO signal goes low and turns on DMOSLO 44 which in turn charges the capacitor 501, readying the circuit to switch LO high and after a deadtime delay HI low which will then turn on DMOSHI 42.

FIG. 1(b) illustrates the corresponding integrator and comparator output voltages. Since the initial charge on the integrator output is approximately −0.8 volts a long delay is incurred before the integrator charges positively enough to trip the comparator. This delay allows enough time to provide for the charging of the capacitor 501. If a longer time is required a lower voltage for the Va of the integrator amplifier 13 can be used. The first time the comparator is tripped, a balanced triangular waveform is established by the feedback loop through the comparator, deadtime, opto, output stage, and RFBD path. The frequency of this oscillation is determined by the integrating capacitor 302, RFBD, B+, B−, and the comparator trip voltages. The comparator trip voltages are symmetrical around the ground potential being determined by resistors 401 and 402 and the power supplies for logic inverter 15. These supplies are assumed to be symmetrical around ground.

Figure 1D:
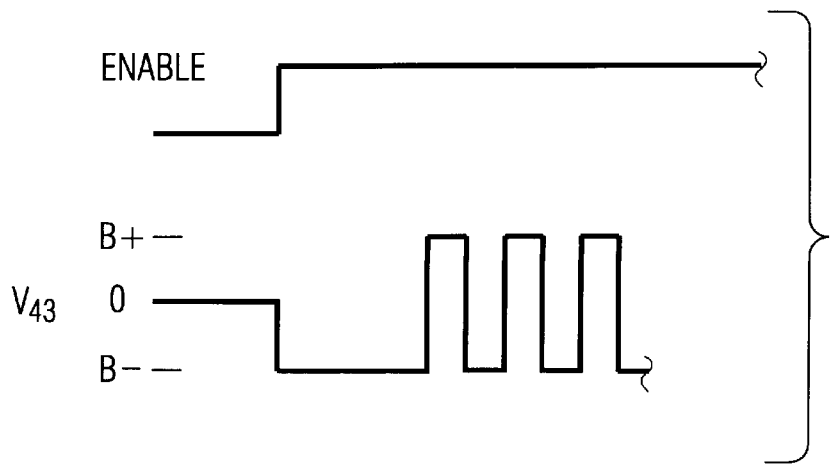
FIG. 1(d) is timing diagram of the initial operation of the low side power transistor.

FIG. 1d illustrates the output voltages at node 43 which drive the output filter, LF and CF. This voltage is 0 volts until the ENABLE makes it's initial positive transition and DMOSLO turns on for the first time.

What is claimed is:

1. In a self oscillating Class D modulator including a low voltage pulse width modulator and an isolated high voltage driver including a high side driver and a low side driver, the improvement comprising:

means for sensing the start up of the modulator;

start-up generator means responsive to the sensing means for generating an ENABLE signal and a MUTE signal; and means responsive to the ENABLE signal for turning on the low side driver before turning on the high side driver.

2. The modulator of claim 1 further comprising an integrator wherein the ENABLE signal is coupled to the integrator for setting the initial charge on the integrator.

3. The modulator of claim 1 wherein the ENABLE signal is controls the low side driver for turning on the low side driver before turning on the high side driver.

4. The modulator of claim 1 further comprising an input stage with an input terminal for receiving an input signal wherein the MUTE signal is coupled to the input stage to mute the output during start-up.

5. The modulator of claim 1, wherein said means for sensing the start up of the modulator comprises at least one comparator, said comparator comparing a reference voltage and a start-up voltage, said comparator issuing said ENABLE signal when said first reference voltage is exceeded by said start-up voltage.

6. The modulator of claim 1, where in said means responsive to the ENABLE signal comprises a deadtime circuit, having a deadtime delay, a HI output and a LO output, said deadtime delay being configured to ensure said HI output and said LO output are not active at the same time.

7. In a self oscillating Class D modulator including a low voltage pulse width modulator and an isolated high voltage driver including a high side driver and a low side driver, the improvement comprising:

means for sensing the start up of the modulator;

start-up generator means responsive to said sensing means for generating an ENABLE signal and a MUTE signal, said start-up generator including means for delaying the generation of the MUTE signal for a set period of time following generation of the ENABLE signal; and means responsive to the ENABLE signal for turning on the low side driver before turning on the high side driver.

8. A self oscillating Class D modulator with an improved start-up circuit comprising:

a modulator input stage, an amplifier stage, an integrator stage, a comparator stage, a driver stage, a coupler stage and an output stage, said stages being connected in series, said integrator stage having an integrator input, analog and digital feedback paths between said output stage and said integrator input, said output stage including high side and low side power transistors;

a start-up generator connected between the modulator and a power source for generating ENABLE and MUTE signals when the power source is connected to the modulator, said start-up generator including a start-up reference voltage and a transmission gate for selectively connecting the start-up reference voltage to the integrator for setting the initial voltage integrated by the integrator in response to the ENABLE signal, and means for connecting the MUTE signal to said modulator input stage to mute the output of the modulator during start-up; and a dead time controller connected to the driver stage and to the ENABLE signal for turning on the low side driver before turning on the high side driver.

9. A self oscillating Class D modulator with an improved start-up circuit comprising:

a modulator input stage, an amplifier stage, an integrator stage, a comparator stage, a driver stage, a coupler stage and an output stage, said stages being connected in series, said integrator stage having an integrator input, analog and digital feedback paths between said output stage and said integrator input, said output stage including high side and low side power transistors;

a start-up generator connected between the modulator and a power source for generating ENABLE and MUTE signals when the power source is connected to the modulator, said start-up generator including a start-up reference voltage and a transmission gate for selectively connecting the start-up reference voltage go the integrator for setting the initial voltage integrated by the integrator in response to the ENABLE signal, and means for connecting the MUTE signal to said modulator input stage to mute the output of the modulator during start-up; and a dead time controller connected to the driver stage and to the ENABLE signal for turning on the low side driver before turning on the high side driver; and a bootstrap capacitor coupled between a power source and the low side power transistor for charging when the low side driver turns on.

10. A self oscillating Class D modulator with an improved start-up circuit comprising:

a modulator input stage, an amplifier stage, an integrator stage, a comparator stage, a driver stage, a coupler stage and an output stage, said stages being connected in series, said integrator stage having an integrator input, analog and digital feedback paths between said output stage and said integrator input, said output stage including high side and low side power transistors;

a start-up generator connected between the modulator and a power source for generating ENABLE and MUTE signals when the power source is connected to the modulator, said start-up generator including a start-up reference voltage and a transmission gate for selectively connecting the start-up reference voltage to the integrator for setting the initial voltage integrated by the integrator in response to the ENABLE signal, means for connecting the MUTE signal to said modulator input stage to mute the output of the modulator during start-up and means for suppressing the MUTE signal after self oscillation begins; and a dead time controller connected to the driver stage and to the ENABLE signal for turning on the low side driver before turning on the high side driver.

11. A process for starting up a self oscillating Class D modulator including a low voltage pulse width modulator and an isolated high voltage driver including a high side driver and a low side driver, including the steps of:

sensing the start up of the modulator;

generating an ENABLE signal and a MUTE signal;

delaying generation of the MUTE signal for a first set period of time following generation of the ENABLE signal; and turning on the low side driver before turning on the high side driver.

12. A process for starting up a self oscillating Class D modulator including a low voltage pulse width modulator and an isolated high voltage driver including a high side driver and a low side driver, including the steps of:

sensing the start up of the modulator;

generating an ENABLE signal and a MUTE signal;

delaying generation of the MUTE signal for a first set period of time following generation of the ENABLE signal;

turning on the low side driver before turning on the high side driver; and turning off the MUTE signal after a second set period of time.

* * * * *